United States Patent [19]
Kochanski

[11] Patent Number: 5,650,913
[45] Date of Patent: Jul. 22, 1997

[54] THERMALLY ACTIVATED CLAMPING APPARATUS AND COMPONENT PART AND METHOD OF USE THEREOF

[75] Inventor: Ronald Peter Kochanski, Arlington Heights, Ill.

[73] Assignee: Motorola, Inc., Schaumburg, Ill.

[21] Appl. No.: 561,741

[22] Filed: Nov. 22, 1995

[51] Int. Cl.⁶ .................................................. H05K 7/20
[52] U.S. Cl. ................................................ 361/704; 257/727
[58] Field of Search .......................... 165/80.2, 80.3, 165/185; 174/16.3; 257/713, 718–719, 726–727; 361/701, 704, 705, 707–710, 717–722

[56] References Cited

U.S. PATENT DOCUMENTS 5,132,873  7/1992  Nelson et al. ........................ 361/701

FOREIGN PATENT DOCUMENTS 2252158  11/1987  Japan ..................... 257/718
3226952  9/1988  Japan ..................... 257/718

Primary Examiner—Gregory D. Thompson
Attorney, Agent, or Firm—Richard A. Sonnentag

[57] ABSTRACT

A surface mountable component (110) is urged toward a substrate (102) during a bonding operation. The apparatus consists of a thermally activated clamping device (TACD) (300) having alloys with differing relative deflection-temperature characteristics. When exposed to elevated temperatures, the thermally activated clamping device (300) deforms a predetermined amount depending upon the heat-energy applied to the thermally activated clamping device (300). This allows for a mounting bracket that applies a force on a component (110) in proportion to an amount of heat-energy applied to the mounting bracket. In addition, the thermally activated clamping device (300) is coupled locally to the substrate in an area surrounding the component which eliminates the need for long, fragile mounting brackets. The method consists of utilizing the relative deflection-temperature characteristics of metals to clamp a component (110) during a bonding operation.

13 Claims, 2 Drawing Sheets

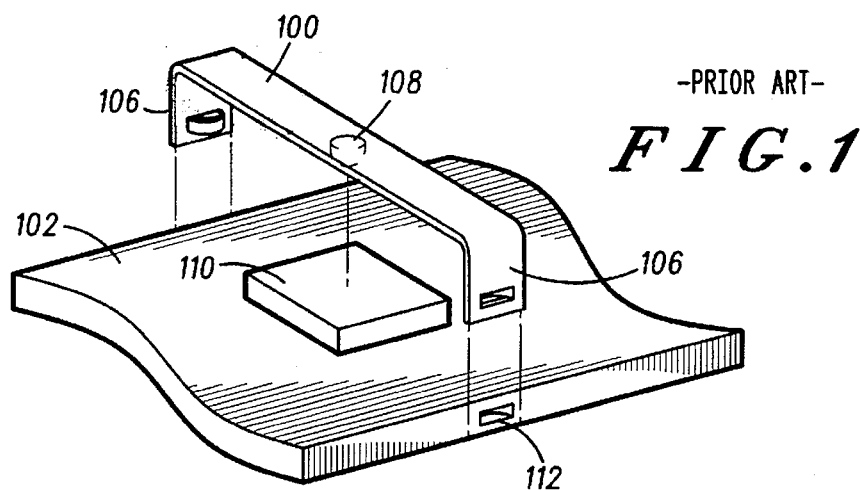
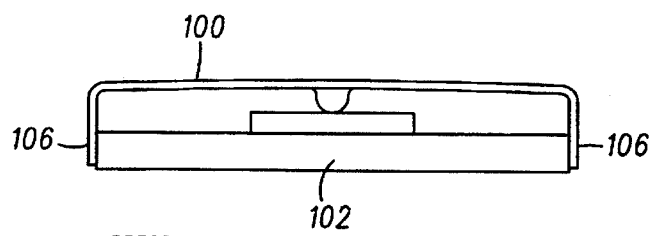
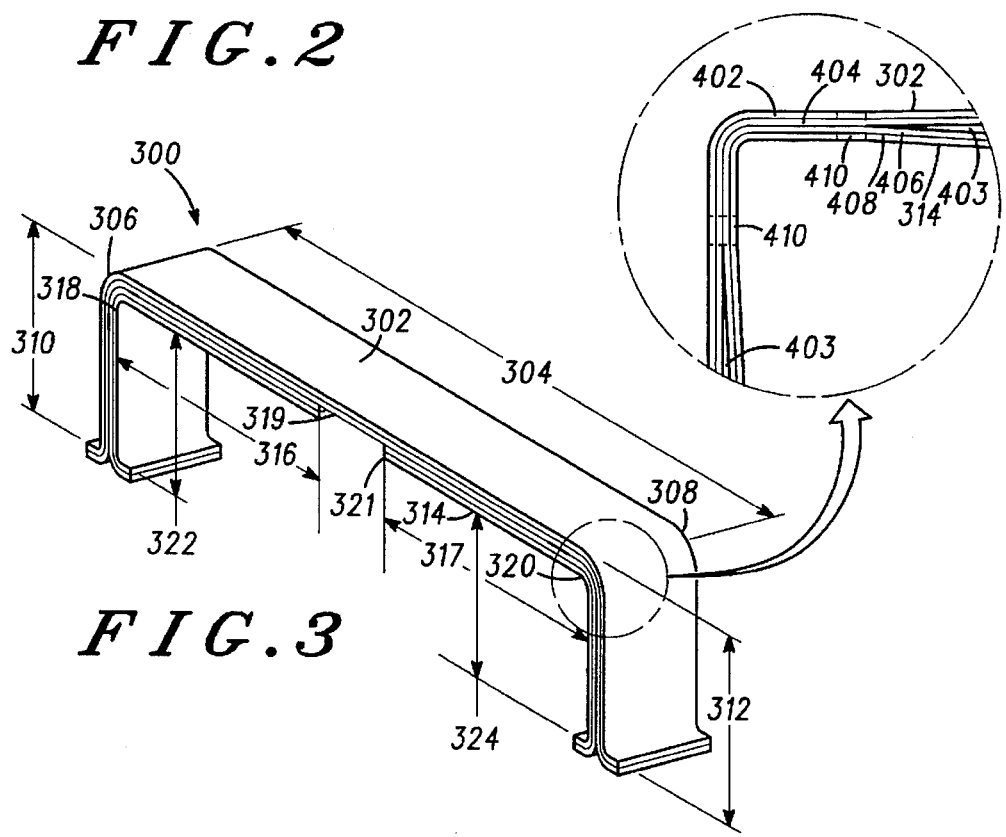

THERMALLY ACTIVATED CLAMPING APPARATUS AND COMPONENT PART AND METHOD OF USE THEREOF

FIELD OF THE INVENTION

The invention is generally related to the mounting of component parts, and more particularly to thermally activated clamping devices used in the mounting of such component parts.

BACKGROUND OF THE INVENTION

For many component parts to be bonded to a substrate, a bonding agent (such as solder-type material or thermally activated epoxy) is used that requires pressure to be applied to the component part during the bonding process. Typical bonding agents include solder or thermally activated epoxy that is heated via an infrared reflow operation during the bonding operation. Typical methods for applying pressure during the bonding process include the use of mounting brackets that snap fit to the substrate over the component part, and then are removed after the component part has been bonded to the substrate. FIG. 1 shows a typical mounting bracket, substrate, and component part.

As can be seen in FIG. 1, the bracket 100 contains extended regions 106 on each end which are used to attach the bracket 100 to the substrate 102. The bracket 100 is attached to the substrate 102 by a snap fit of the extended regions 106 to the recessed regions 112 existing on the substrate 102. The bracket 100 is equipped with a dimple 108 that comes into contact with the component part 110, and applies a predetermined force to the component part 110 after coupling of the substrate 102 and the bracket 100. Typical brackets 100 are made from a metal or metal alloy that can withstand temperatures experienced in the bonding process. The substrate 102 is generally formed from copper, or a ceramic type material. FIG. 2 shows an edge-on view of an assembled prior art mounting bracket 100, substrate 102, and component part 110.

One problem that exists with the current construction of mounting brackets is that a relatively large amount of force is required to snap fit the bracket to the substrate. Since component parts are generally not coupled to the substrate when the bracket is attached, attachment of the bracket to the substrate has the effect of jarring the component parts out of their appropriate positions. Because of this, much time is wasted in realigning component parts onto the substrate after the brackets have been attached. Similarly, the current construction of mounting brackets require a relatively large force to remove them from the substrate. This large removal force results in additional tooling being necessary to remove the bracket from the substrate. In particular, the tooling is needed to separate the extended regions 106 from the recessed regions 112 existing on the substrate 102.

Another fault that exists with current construction mounting brackets is that the mounting brackets are attached to the substrate at the substrate's edge. This results in two problems. First, the use of large substrates requires extremely long mounting brackets be used. These long brackets become fragile and are often warped beyond use after only several uses. Second, the substrate requires recessed areas on its edges to accommodate the mounting bracket. These recessed areas tend to weaken the substrate and cause an excessive amount of substrates to be damaged during the removal of the mounting bracket.

Thus, a need exists for a mounting bracket that requires very little insertion/removal force and does not require attachment to the substrate at the substrate's edges, but effectively holds the component in place during the bonding process.

BRIEF DESCRIPTION OF THE DRAWINGS

FIG. 1 generally depicts a prior art mounting bracket, substrate, and component part.

FIG. 2 shows a side view of an assembled prior art mounting bracket, substrate, and component part.

FIG. 3 shows a partial cross-sectional view of a thermally activated clamping device, substrate, and component part in accordance with the invention.

FIG. 4 shows an exploded view of an area surrounding spot welds of a thermally activated clamping device during a bonding process.

DETAILED DESCRIPTION OF A PREFERRED EMBODIMENT

Figure 5:
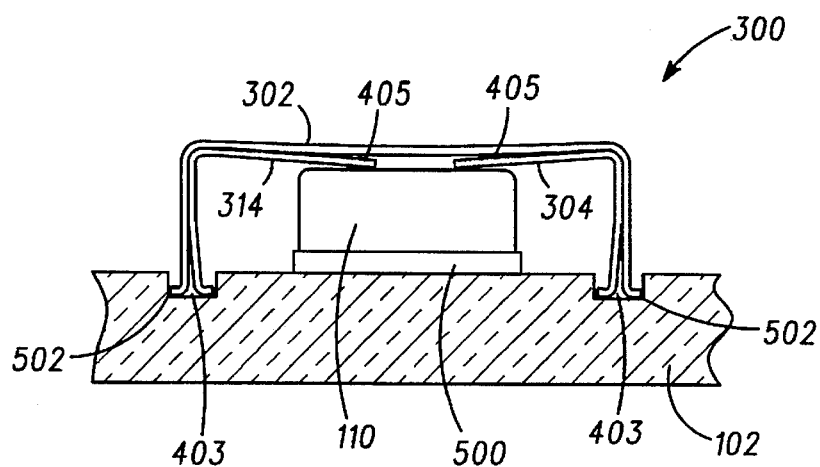
FIG. 5 shows a side view of a thermally activated clamping device, substrate, and component part in accordance with the invention during a bonding process.

The present invention solves the above mentioned problems of mounting a component to a substrate by replacing the prior art mounting bracket with a much smaller thermally activated clamping device (TACD) composed of metals that have differing relative deflection-temperature characteristics. When exposed to elevated temperatures, the TACD deforms a predetermined amount depending upon the heat-energy applied to the device. This allows for a mounting bracket that applies a force to a component part in proportion to an amount of heat-energy applied to the mounting bracket. By deforming when heated, the TACD solves the problem with the prior art bracket of large forces needed for insertion/removal. In addition, the TACD is coupled locally to the substrate in an area surrounding the component part and does not clamp to the edge of the substrate. Because of this, the need for long, fragile mounting brackets which couple to the edge of the substrate is eliminated.

Generally stated, one embodiment of the present invention comprises a component part mounted to a substrate via the steps of placing the component on the substrate in a predetermined position, placing a bonding agent in contact with the substrate and the component, positioning a thermally activated clamping device TACD such that at least a portion of the TACD is in close proximity to the component, heating the substrate, the component, and the TACD, and finally, applying a force on the component with the TACD part, in response to an amount of heat applied to the TACD.

Another form of the invention comprises TACD having a first material having a first coefficient of thermal expansion (CTE), and a second material having a second CTE, the second material coupled to the first so that the TACD deforms in a predetermined manner in response to a change in temperature.

FIG. 3 shows partial cross-sectional view of a TACD 300 in accordance with the present invention. In the preferred embodiment, the TACD 300 comprises a first clamping portion 302 comprising bonded alloys with differing coefficients of thermal expansion. For the sake of simplicity, the bonded alloys with differing coefficients of thermal expansion are described later in the application. Continuing, the first clamping portion 302 comprises a first planar portion 304 having a first end 306 and a second end 308. The first clamping portion 302 also includes a second planar portion 310 having the first end 306 in common with the first end of the first planar portion 304 in substantially a perpendicular arrangement. Finally, the first clamping portion 302 further includes a third planar portion 312 having the second end 308 in common with the first planar portion 304 in substantially a perpendicular arrangement. In the preferred embodiment, the second planar portion 310 and the third planar portion 312 are juxtaposed.

The TACD 300 also includes a second clamping portion 314 also comprising bonded alloys with differing coefficients of thermal expansion. Again, for the sake of simplicity, the bonded alloys with differing coefficients of thermal expansion are described later in the application. Continuing, the second clamping portion 314 comprises a fourth planar portion 316 having a first end 318 and a second end 319. The second clamping portion 314 further includes a fifth planar portion 322 having the first end 318 in common with the fourth planar portion 316 in substantially a perpendicular arrangement. The second clamping portion 314 also includes a sixth planar portion 317 having a first end 320 and a second end 321. The second clamping portion 314 finally includes a seventh planar portion 324 having the first end 320 in common with the sixth planar portion 317 in substantially a perpendicular arrangement. In the preferred embodiment, the first planar portion 304 is adjacent to the fourth planar portion 316 and the sixth planar portion 317, the second planar portion 310 and the fifth planar portion 322 are adjacent to one another and the third planar portion 312 and the seventh planar portion 324 are adjacent to one another.

FIG. 4 shows an exploded view of the first clamping portion 302 and the second clamping portion 314, each comprising bonded alloys with differing coefficients of thermal expansion in accordance with the invention. As can be seen in FIG. 4, the TACD 300 includes spot welds 410 to secure the first clamping portion 302 to the second clamping portion 314. In the preferred embodiment, the first clamping portion 302 includes an alloy 402 having a low coefficient of thermal expansion (CTE) bonded to an alloy 404 having a high CTE. The second clamping portion 314 has an alloy 406 having a high CTE bonded to an alloy 408 having a low CTE. In the preferred embodiment, the alloys 402 and 408 are comprised of a mixture of 36% Nickel/64% Iron while the alloys 404 and 406 are comprised of a mixture of 72% Manganese/18% Copper/10% Nickel. As one of ordinary skill in the art will appreciate, the alloys (and their percent compositions) may vary depending on the application, etc.

With reference to FIG. 4 and FIG. 5, during the bonding process (i.e., when heat is applied), first clamping portion 302 will flex toward a component 110 mounted below the TACD 300. The first clamping portion 302 flexes toward the component 110 because the alloy 402, having a lower CTE than the alloy 404, expands at a lower rate than the alloy 404, thus causing a deformation in the first clamping portion 302. In the preferred embodiment, the deformation is proportional to the amount of heat-energy applied during the bonding process. Similarly, the second clamping portion 314 flexes toward the component 110 because the alloy 406, having a higher CTE than the alloy 408, will expands at a greater rate than the alloy 408, thus causing a deformation in the second clamping portion 314.

The deformation can be seen in FIG. 4 to create gaps 403 between the first clamping portion 302 and the second clamping portion 314. The size of the gaps 403 are predetermined based on the amount of heat the TACD 300 will experience during the bonding process. As such, the deformation will cause the second clamping portion 314 to urge the component 110 toward the substrate 102 so that the component is adequately secured to the substrate 102 during the bonding process. In the preferred embodiment, the component is mounted to the substrate via a bonding agent 500, which can either be a solder-type material or thermally activated epoxy. One of ordinary skill in the art will appreciate that many types of bonding agents 500 can be beneficially employed.

With reference to FIG. 3, FIG. 4 and FIG. 5, the second planar portion 310 coupled to the fifth planar portion 322 can be seen to constitute a "leg". The same can be said about the coupling of the third planar portion 312 and the seventh planar portion 324. As can be best seen in FIG. 5, the legs are mounted in recesses 502 of the substrate 102. In the preferred embodiment, the recesses 502 are located near (i.e., locally) the component to be mounted. When placed in recesses 502 of the substrate 102, the legs will deform (as explained above) to generate the gaps 403 as shown in FIG. 4 to secure the TACD 300 with the substrate 102 during the bonding process (i.e., when heat is applied). Consequently, during the bonding process, the TACD 300 is sufficiently secured to the substrate 102 so that it is capable of sufficiently urging the component 110 to the substrate 102. As such, the component 110 is adequately bonded to the substrate 102 by merely placing the TACD 300 locally by the component 110 in the recesses 502; large brackets which span the length of the carrier and require a force-fit are eliminated.

Figure 6:
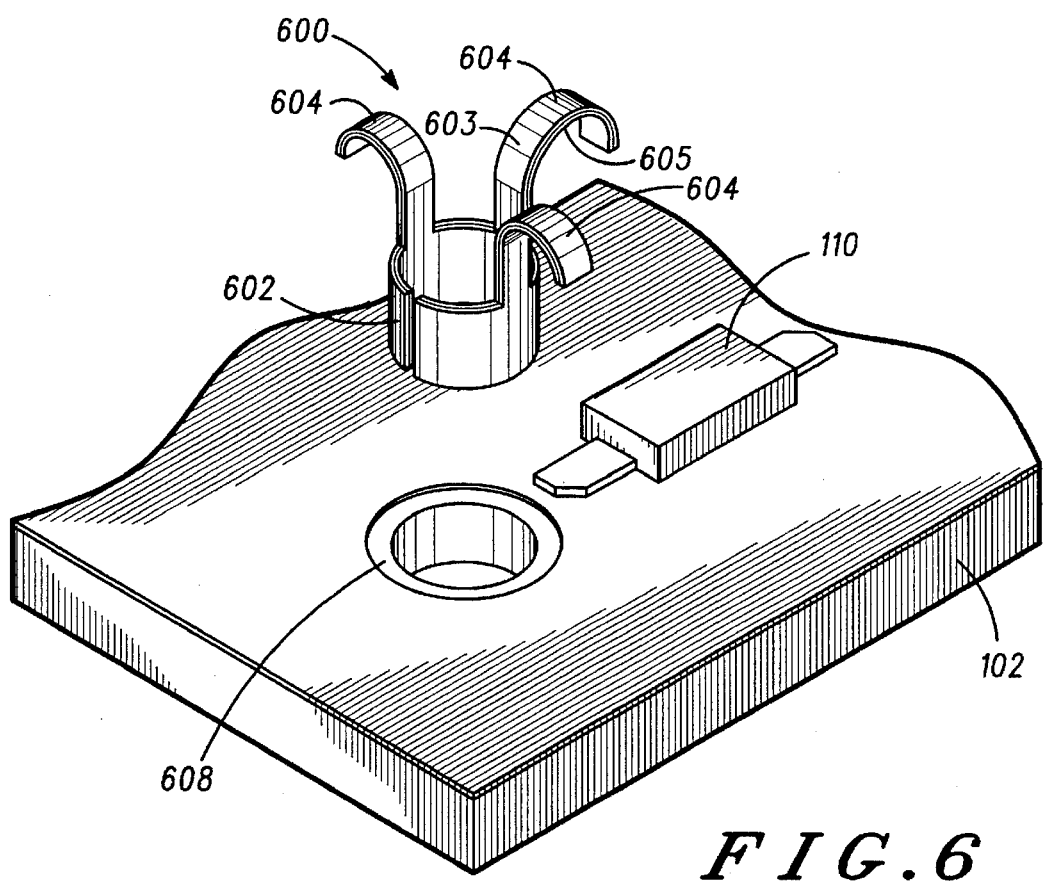
FIG. 6 shows an alternate embodiment of a thermally activated clamping device, substrate, and component part in accordance with the present invention.

FIG. 6 shows a TACD 600, substrate 102, and component part 110 in an alternate embodiment in accordance with the present invention. In this embodiment, the TACD 600 consists of a mounting ring 602 and three arms 604. Each of the three arms 604 comprise the bonded alloys (like alloys 402 and 404 of the first clamping portion 302 shown in FIG. 4) which have differing coefficients of thermal expansion in accordance with the invention. In the preferred embodiment, the outer layer 603 has the high CTE (the same mixture as the alloy 404), while the inner layer 605 has the low CTE (the same mixture as the alloy 402).

As can be seen in FIG. 6, the TACD 600 is coupled to the substrate 102 by sliding the mounting ring 602 into the recessed area 608 existing on the substrate 102. When coupled to the substrate, the arms 604 of the TACD 600 are positioned in a way that allows one of them to come into contact with the component part 110, while the mounting ring 602 is coupled to the substrate 102 via a recessed area 608 that exists on the substrate 102. When heated, the mounting ring 602 expands, tightly into the recessed area 608, thus sufficiently securing the TACD 600 to the substrate 102. Also, the arms 604 of the TACD 600 "curl" due to the difference in CTE's between the layer 603 and 605, which applies a force to the component part 110, sufficiently securing the component 110 to the substrate 102 during the bonding operation in accordance with the invention.

While the invention has been particularly shown and described with reference to a particular embodiment, it will be understood by those skilled in the art that various changes in form and details may be made therein without departing from the spirit and scope of the invention.

What I claim is:

1. An apparatus including a component mounted to a substrate, the apparatus manufactured via the steps of:

placing a bonding agent in contact with the substrate and the component;

placing the component on the substrate in a predetermined position;

coupling a thermally activated clamping device to the substrate such that at least a portion of the thermally activated clamping device is in close proximity to the component;

heating the substrate, the component, and the thermally activated clamping device;

urging the component towards the substrate in response to an amount of heat applied to the thermally activated clamping device, wherein the urging to the component is generated from a deformation of the thermally activated clamping device; and removing the thermally activated clamping device after the step of heating.

2. The apparatus of claim 1, wherein the bonding agent comprises a solder-type material.

3. The apparatus of claim 1, wherein the bonding agent comprises a thermally activated epoxy.

4. The apparatus of claim 1, wherein the substrate further comprises a plurality of recessed areas used to position the thermally activated clamping device.

5. A component and substrate coupled together by the following method:

placing a thermally activated bonding agent in contact with the substrate and the component;

placing the component on the substrate in a predetermined position;

placing a thermally activated clamping device on the substrate wherein at least a portion of the thermally activated clamping device lies within a recess located within the substrate and at least a portion of the thermally activated clamping device is in close proximity to the component;

heating the substrate, the component, and the thermally activated clamping device;

securing the thermally activated clamping device to the substrate and urging the component towards the substrate in response to an amount of heat applied to the thermally activated clamping device and removing the thermally activated clamping device after the step of heating.

6. The component mounted to a substrate of claim 5, wherein the bonding agent comprises a solder-type material.

7. The component mounted to a substrate of claim 5, wherein the bonding agent comprises a thermally activated epoxy.

8. A thermally activated clamping device for placement on a substrate at least partially overlapping a component part, said thermally activated clamping device comprising:

a first material having a first coefficient of thermal expansion (CTE); and, a second material having a second CTE, the second material coupled to the first so that the thermally activated clamping device deforms in a predetermined manner in response to a change in temperature.

9. The thermally activated clamping device of claim 8, wherein the thermally activated clamping device deforms in a predetermined manner to urge the component toward the substrate in response to the change in temperature.

10. The thermally activated clamping device of claim 8 wherein the second material further comprises a material that deforms to produce a gap between the first and the second material.

11. The thermally activated clamping device of claim 8 wherein the first and second material further comprises a material that deforms to produce a curl in the first and the second material.

12. The thermally activated clamping device of claim 8 wherein first material comprises a 36% Nickel/64% Iron alloy and the second material comprises a 72% Manganese/18% Copper/10% Nickel alloy.

13. A clamping apparatus comprising:

a first clamping portion having bonded alloys with differing coefficients of thermal expansion, said first clamping portion comprising:

a first planar portion having a first end and a second end;

a second planar portion having a first end, a second end, and a first surface, said first end being coupled to said first end of said first planar portion in substantially a perpendicular arrangement; and a third planar portion having a first end and a second end, said first end being coupled to said second end of said first planar portion in substantially a perpendicular arrangement and juxtaposed to said second planar portion; and a second clamping portion having bonded alloys with differing coefficients of thermal expansion, said second clamping means comprising:

a fourth planar portion having a first end, a second end, and a first surface, said first surface being disposed adjacent a first portion of said first planar portion;

a fifth planar portion having a first end, a second end, and a first surface, said first end being coupled to said first end of said fourth planar portion in substantially a perpendicular arrangement and being disposed adjacent said first surface of said second planar portion;

a sixth planar portion having a first end, a second end, and a first surface, said first surface being disposed adjacent a second portion of said first planar portion and said first end being juxtaposed to said second end of said fourth planar portion; and a seventh planar portion having a first end, a second end, and a first surface, said first end being coupled to said second end of said sixth planar portion in substantially a perpendicular arrangement and juxtaposed to said fifth planar portion, said first surface being disposed adjacent said third planar portion.

* * * * *